(12) United States Patent
Cranford, Jr. et al.

(10) Patent No.: US 7,408,374 B2
(45) Date of Patent: Aug. 5, 2008

(54) SYSTEMS AND METHODS FOR CONTROLLING OF ELECTRO-MIGRATION

(75) Inventors: Hayden Clavie Cranford, Jr., Cary, NC (US); Louis Lu-Chen Hsu, Fishkill, NY (US); James Stephen Mason, Eastleigh (GB); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 11/566,796

(22) Filed: Dec. 5, 2006

(65) Prior Publication Data

US 2007/0103173 A1 May 10, 2007

Related U.S. Application Data

(62) Division of application No. 11/140,765, filed on May 31, 2005, now Pat. No. 7,339,390.

(51) Int. Cl.
*G01R 31/26* (2006.01)
(52) U.S. Cl. .................................................... 324/765
(58) Field of Classification Search ................ 324/537, 324/765, 158.1, 73.1, 763, 713, 766, 525, 324/527, 719; 438/14, 17–18, 758; 714/728, 714/733, 731; 716/4–5
See application file for complete search history.

(56) References Cited

U.S. PATENT DOCUMENTS 5,514,974 A 5/1996 Bouldin (Continued)

FOREIGN PATENT DOCUMENTS

JP 3228430 A 10/1991

(Continued)

OTHER PUBLICATIONS

Jiang Tao, et al., "Metal Electromigration Damage Healing Under Bidirectional Current Stress," IEEE Electron Device Letters, vol. 14, No. 12, Dec. 1993, pp. 554-556.

(Continued)

*Primary Examiner*—Jemele M Hollington
*Assistant Examiner*—Tung X Nguyen
(74) *Attorney, Agent, or Firm*—Joscelyn G. Cockburn; Schubert Osterrieder Nickelson PLLC

(57) ABSTRACT

Systems and methods for controlling electro-migration, and reducing the deleterious effects thereof, are disclosed. Embodiments provide for reversal of an applied voltage to an integrated circuit when a measurement indicative of an extent of electro-migration indicates that a healing cycle of operation is warranted. During the healing cycle, circuits of the integrated circuit function normally, but electro-migration effects are reversed. In one embodiment, micro-electro-mechanical switches are provided at a lowest level of metallization to switch the direction of current through the levels of metallization of the integrated circuit. In another embodiment, if the measurement indicative of the extent of electro-migration exceeds a reference level by a specifiable amount, then the voltage applied to the integrated circuit is reversed in polarity to cause current to switch directions to counter electro-migration. A plurality of switches are provided to switch current directions through a lowest level of metallization so that the circuits function normally even though the polarity of the applied voltage has been reversed.

6 Claims, 7 Drawing Sheets

U.S. PATENT DOCUMENTS

| | | | |
|---|---|---|---|
| 6,147,361 A | 11/2000 | Lin et al. | |
| 6,320,391 B1 * | 11/2001 | Bui | 324/537 |
| 6,614,251 B2 * | 9/2003 | Ootsuji | 324/765 |
| 2004/0012492 A1 | 1/2004 | Testin et al. | |

FOREIGN PATENT DOCUMENTS

| | | |
|---|---|---|
| JP | 3088299 A | 6/1992 |
| JP | 4070006 A | 2/1993 |
| JP | 2000040727 A | 2/2000 |

OTHER PUBLICATIONS

IBM Technical Disclosure Bulletin, "On Chip Electromigratoin Sensor using Silicon Device," May 1992, pp. 197-198.

IBM Technical Disclosure Bulletin, "Metal Electromigration Sensor," Sep. 1983, pp. 1998-1999.

IBM Technical Disclosure Bulletin, "Electromigration Failure Detection," Jan. 1983, p. 4076.

* cited by examiner

SYSTEMS AND METHODS FOR CONTROLLING OF ELECTRO-MIGRATION

This application is a divisional of U.S. application Ser. No. 11/140,765 filed May 31, 2005 now U.S. Pat. No. 7,339,390.

FIELD

The present invention is in the field of electro-migration in integrated circuits. More particularly, the invention is in the field of controlling electro-migration characteristics of metal wirings in an integrated circuit.

BACKGROUND

Reliability of integrated circuits is a significant consideration both in terms of fabrication and subsequent use. Attempts are continually being made to ensure high reliability at all stages of the fabrication process. For example, where feasible, Electro-Migration (EM) test structures are incorporated on semiconductor wafers with the formation of integrated circuits therein. Each integrated circuit can then individually be electrically bonded to the test structures to determine whether electro-migration may cause failure of the integrated circuit.

Today's metallization practice is to layer aluminum (Al) interconnects with thin films of refractory materials, such as titanium or tungsten, so that if a void in the aluminum forms, electrical continuity through the interconnect is maintained, albeit at increased resistance. Unfortunately, the increased resistance is typically insufficient to identify the failed interconnect conductor. This is because the additional resistance due to the aluminum void is often insufficient to distinguish the interconnect line from a normal resistance sampling after accounting for measurement variations.

One area of traditional concern is the electro-migration (EM) characteristics of metal (e.g., aluminum, aluminum alloys, copper, copper alloys and/or refractory metal) conductors in the integrated circuit. Because of the very small line widths required for present-day IC's, the current density in these conductors, including runners and contacts, is very high, often exceeding $1 \times 10^5$ amps/cm$^2$ in normal device operation. Therefore, if the metal is inadvertently thinner (or narrower) in some portions of the runner than in others, the current density will be even higher than the intended value at those locations. Since the failure rate due to EM problems increases rapidly as the current density increases, such unintended thinning of the runners may lead to unacceptable reliability of the IC. Still other factors may affect the EM characteristics, such as the presence of impurities or precipitates in the metal that forms the runners, the grain size of the metal, and various other geometry limiting effects.

Electro-migration has long been identified as the major metal failure mechanism. It is one of the worst reliability concerns for VLSI circuits and manufacturing. The problem not only needs to be overcome during process development period in order to qualify the process, but it also persists through the life time of the chip. Voids are created inside of the metal conductors due to metal ion movement caused by high density of current flow. In short, electro-migration failure is caused by a positive divergence of the ionic flux leading to an accumulation of vacancies, forming voids in the metal. It appears that ions are moved "downstream" by the force of "electron wind". Electro-migration and its related failures therefore can be categorized as a wear-out mechanism. In general the failure rate is proportional to current density and the surrounding temperature. EM problem becomes worse as the feature sizes both in width and thickness of metal wirings are further scaled. The current density for wires that lack sufficient cross-sectional area can easily exceed $1 \times 10^5$ amps/cm$^2$. It has been observed that metal lines crossing over steep corners tend to be thinner than normal. These corner regions as well as via structures are the most common locations for EM to take place.

Methods to slow down the EM effect have been proposed, including: (1) adding copper (0.5-4%) into Al film, (2) adding Ti (0.1-0.5%) into the Al film, (3) using CVD tungsten metal studs (4) using diffusion barrier liners, etc. Acceleration EM tests carried out using high current, voltage and temperature stress can screen out defective chips in a relatively short period of time. Several methods have been proposed to teach how to conduct these EM tests. One method to measure EM effect is taught by U.S. Pat. No. 6,147,361, entitled "Poly-silicon Electro-migration Sensor Which Can Detect and Monitor Electro-migration in Composite Metal Lines on Integrated Circuit Structures with Improved Sensitivity". The EM sensor described in this patent has a poly-silicon body, a monitored metal piece, and two electrodes. The electrodes are used to probe the connectivity of the EM sensor built by using an intrinsic poly-silicon element. A long metal that is placed on top of the sensor is stressed by a high voltage. When the EM mechanism occurs within the metal, the resulting local joule heating will cause the mobility of the senor to drastically increase. This is an indirect measurement of EM. It doesn't test metal with topology with corners and via contact regions.

A better way to test EM is to directly measure resistance of a test structure formed by metal wiring as described in the U.S. Pat. No. 5,264,377, entitled "Integrated Circuit Electro-migration Monitor". A test structure is designed to measure wire resistance in terms of voltage drop after a period of high-voltage and high-temperature stress. Again, this test structure can detect EM failure only on the emulated wires. That is, the wire, made of one metal level, exhibits only a small artificial topology, which is far from reality.

An improved test structure is proposed in the U.S. Pat. No. 5,514,974, entitled "Test Device and Method for Signaling Metal Failure of Semiconductor Wafer". As described, the metal interconnects under test contain a plurality of metal segments connected together with vias. The structure is closer to real life interconnects. The resistance of the test structure is compared to a control structure which is less prone to failure. If the resistance deviation between test and control structures exceeds a certain level, the part fails the test and is then rejected. This is a more direct measurement of EM.

However, all the EM testing methods proposed so far can only be done at wafer level and during a specific test mode. These test sites are bulky and usually are built along the kerf area adjacent to a chip, or inside a specially designed test chip. These testing methods were focused on process qualification and/or screening out bad chips during burn-in tests. Once the chips are diced and packaged, the capability of EM monitoring through out its life time doesn't exist. EM degradation doesn't stop after the chip is installed in a system and shipped to customers. One may desire, therefore, an on-chip EM sensor that would continue to monitor the EM degradation when the chip is in service. Such a sensor would be extremely useful for an expensive, sophisticated system to predict a chip's life time. Moreover, one may desire a system that can perform a self-healing process to cure damage done by EM.

SUMMARY

The problems identified above are in large part addressed by systems and methods disclosed herein for monitoring and controlling electro-migration of metal wirings in an integrated circuit Embodiments include a system comprising an electro-migration sensor to monitor a resistance and output a measurement voltage indicative of a value of the resistance. The resistance value is affected by electro-migration so that the measurement voltage is indicative of an extent of electro-migration. An embodiment further comprises circuitry to compare the measurement voltage to a reference voltage. A switching network conditionally switches between applying a forward supply voltage to a portion of the integrated circuit and applying a reverse supply voltage to the portion of the integrated circuit. The switching network is responsive to a condition wherein the measurement voltage exceeds the reference voltage by a specifiable amount. The switching network may be adapted to switch from an applied forward supply voltage condition to an applied reverse supply voltage condition after a power-down sequence of the integrated circuit. The switching network may comprise micro-electro-mechanical switches in the integrated circuit to switch direction of current in a layer of metallization of the integrated circuit.

Another embodiment is an integrated circuit with controllable electro-migration characteristics that includes a resistance structure comprising metallization affected by electro-migration. A circuit produces a measurement voltage indicative of the resistance at a first input of a comparator. A comparator compares the measurement voltage to a reference voltage received at a second input of the comparator. A plurality of switches conditionally switch between a forward circuit path and a reverse circuit path, the switches responsive to a condition wherein the measurement voltage exceeds the reference voltage by a first specifiable amount. In one embodiment, using a forward circuit path condition, a first resistance is measured to produce a measurement voltage, and during a reverse circuit path condition, a second resistance is measured to produce a measurement voltage.

Another embodiment is a method for controlling electro-migration of metal wirings in an integrated circuit during circuit operation. The method comprises measuring the resistance of a sample structure within the integrated circuit to produce a measurement and comparing the measurement to a reference level. The method further comprises applying a forward voltage to a portion of the wiring of the integrated circuit until the measurement varies from the reference level by at least a first specifiable amount; and then applying a reverse voltage to the same portion of the wiring of the integrated circuit until the measurement varies from the reference level by at least a second specifiable amount

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Systems and methods for controlling electro-migration, and reducing the deleterious effects thereof, are disclosed. Embodiments provide for reversal of an applied voltage to an integrated circuit when a measurement indicative of an extent of electro-migration indicates that a healing cycle of operation is warranted. During the healing cycle, circuits of the integrated circuit function normally, but electro-migration effects are reversed. In one embodiment, micro-electro-mechanical switches are provided at a lowest level of metallization to switch the direction of current through the levels of metallization of the integrated circuit. In another embodiment, if the measurement indicative of the extent of electro-migration exceeds a reference level by a specifiable amount, then the voltage applied to the integrated circuit is reversed in polarity to cause current to switch directions to counter electro-migration. A plurality of switches are provided to switch current directions through a lowest level of metallization so that the circuits function normally even though the polarity of the applied voltage has been reversed.

Figure 1A:
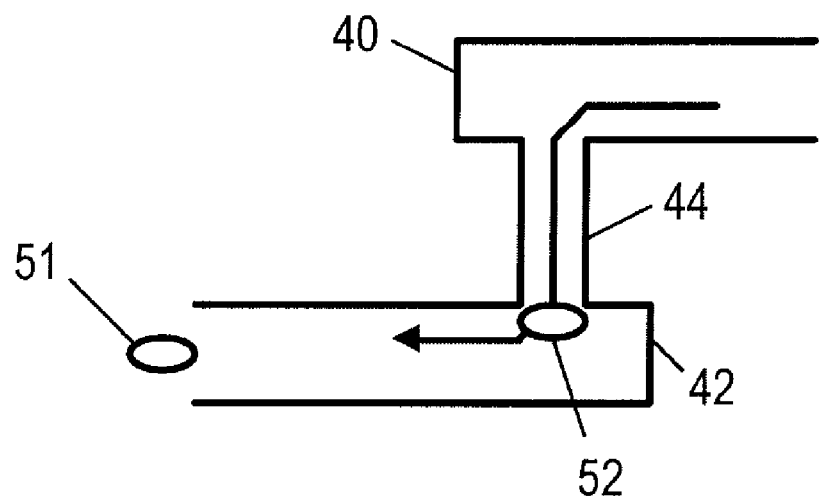
FIG. 1A depicts a via interconnect under forward stressing.
Figure 1B:
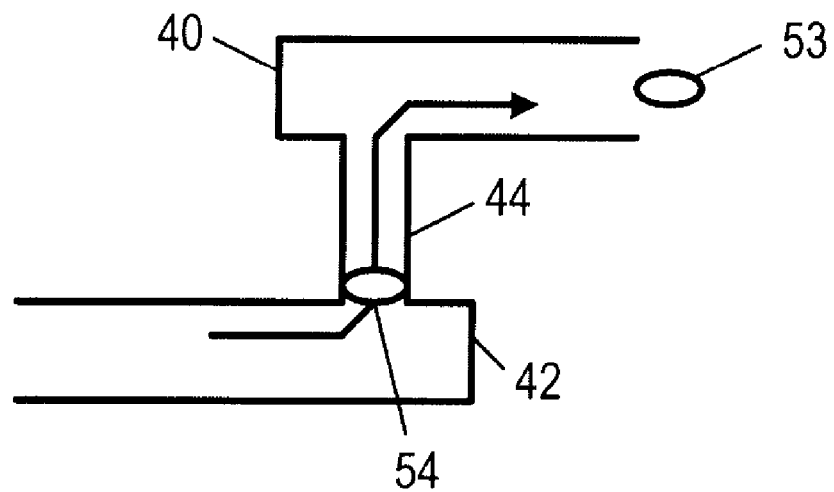
FIG. 1B depicts a via interconnect under reverse stressing.

FIGS. 1A and 1B show a side view of an upper metal conductor 40 connected to a lower metal conductor 42 by a via 44. These figures illustrate that when the metal lines are stressed with a reverse bias, a void formed due to electro-migration can be reduced at first and then formed again at other locations. FIG. 1A shows a forward stress condition and FIG. 1B shows a reverse stress condition. In FIG. 1A current flows from upper metal wire 40 to lower wire 42. A void 52 is formed underneath the barrier layer of the via and extra material 51 is found down stream. In FIG. 1B, current is in the opposite direction, or from the lower conductor to the upper conductor. The void underneath the barrier layer disappears, but after some time a new void 54 above the barrier layer is formed and extra material 53 accumulates to a location in the upstream.

It has been studied (Appl. Phys. Lett. 59 (1), 129, July 1991) that void size is proportional to the stress time. When a reverse stress is applied, the size of the void is reduced first and then grows bigger again. The number and size of EM voids present on a metal conductor have been measured versus stress time. The results show that some of the EM damage caused by the forward current in two hours was healed during the reverse current period. Similarly, the next period under forward current heals some damage created by current reversal during the previous period. Thus, embodiments of the invention cause a reversal of applied voltage to counter effects of electro-migration.

Japanese Patent No. JP4070006A discloses a circuit for reversing the direction of a current in a layer of metallization used to provide power to circuit elements. However, this method has several disadvantages. In the disclosed system ground lines are not swapped and the lowest level of metallization and higher levels of metallization are not treated. Also, the MOSFET switching means is inefficient and presents undesirable capacitance. Further, the reversal of power supply direction is at fixed intervals. There is provided no EM sensor for intelligent application of current reversal.

Embodiments disclosed herein are not meant to replace the existing EM testing methodology. The wafer level test, qualification test and burn-in test should be performed. Rather, embodiments may be employed to monitor the qualities of the metal interconnects during the life-time of the chip. When the quality of interconnects degrade beyond a predetermined threshold level, a healing process is triggered. An automatic self-healing process for a critical portion of the chip, or the whole chip, will cure damage caused by EM. Embodiments may schedule reverse EM stress by re-powering the system while the power supply lines and the ground lines are swapped by way of MEMS (Micro-Electro-Mechanical Systems) switches so that current flows in a reverse direction. During the repairing cycle, the circuit system functions normally. Thus, embodiments enable fabrication of an integrated circuit system that is more forgiving of EM degradation than a conventional system. EM ground rules can be significantly relaxed, enabling further reduction in chip size.

Implementing MEMS switches in semiconductor integrated circuits (ICs) is found to have many advantages. These include (1) low insertion loss, (2) ideally no DC power consumption, (3) high linearity and (4) broad bandwidth performance. Embodiments may therefore employ MEMS switches to implement monitoring and self-healing of electro-migration. This enables relaxation of the metal ground rule which was originally determined by the worst case electro-migration scenario. Another advantage of using the reverse EM approach described herein is that the operation is handled automatically by an on-chip EM sensing unit to monitor and correct the problem by applying reverse EM stressing. During the course of the self-healing cycle, the chip is operated normally with power supply lines and ground lines swapped.

Figure 2:
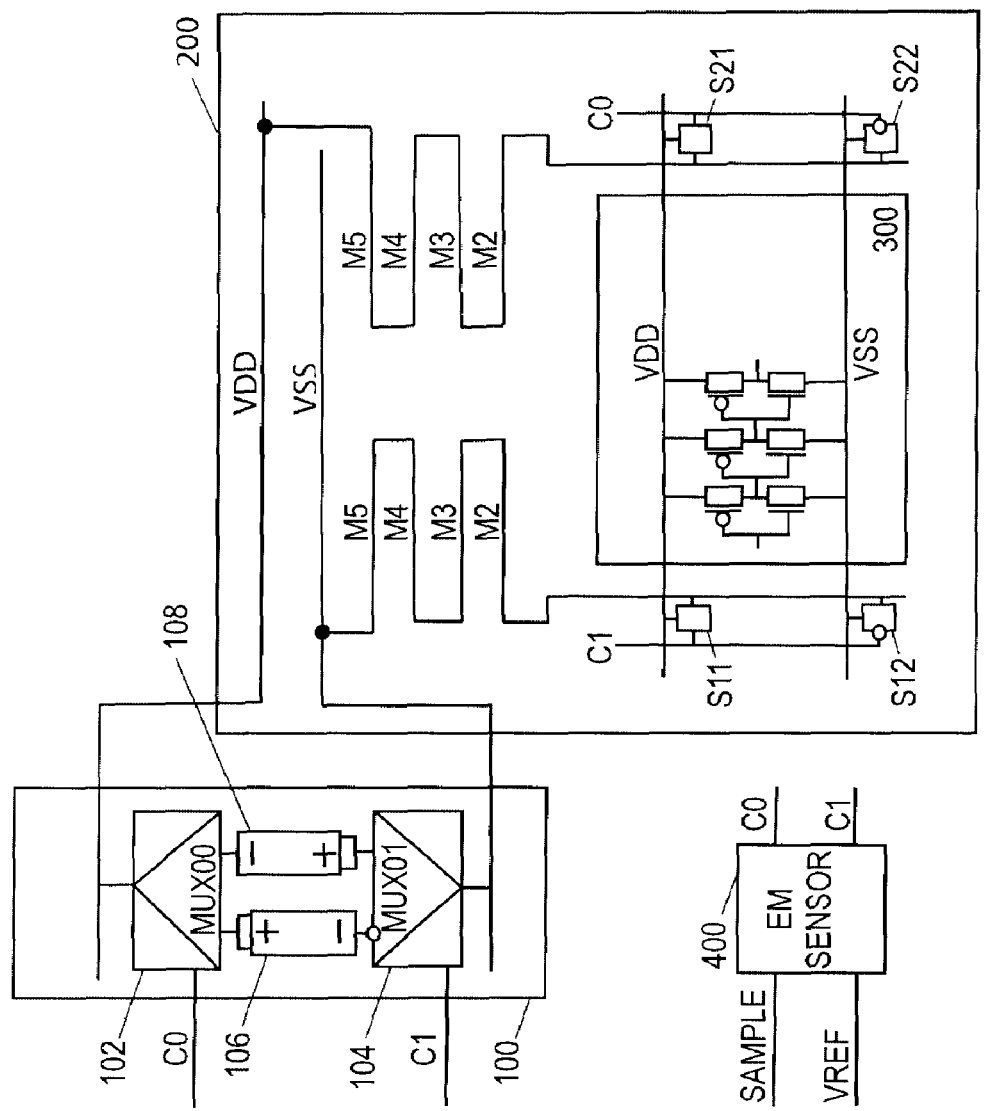
FIG. 2 depicts an embodiment for sensing electro-migration effects.

FIG. 2 shows one embodiment of a reversible-EM system. A MEMS switch package 100 is integrated with circuitry 200. Chip circuitry 200 comprises a plurality of metallization layers, m1 through m5, connected by way of via interconnects. At a lowest metallization layer, chip circuitry 200 comprises a plurality of circuit elements 300. One or more EM sensors 400, whose details will be described herein, are used to sample a monitored metal wiring resistance. When that resistance is higher than a predetermined level, a sensor will trigger a warning signal demanding the system to start a reverse stressing operation. The power supply lines and ground lines are then swapped to force current flow on these wires in an opposite direction. In other words, all the supply lines now become ground lines and vice versa. This operation takes place during a power-on sequence in order not to interrupt the current operation.

The reversible EM system shown in FIG. 2 comprises two opposite polarity power supply sources 106 and 108, i.e. batteries, that supply power to circuit chip 200. The system further comprises MEMs multiplexers 102 and 104, to alternately switch between supply sources 106 and 108. In a condition of applying a forward voltage, multiplexers 102 and 104 connect supply source 106 to circuit chip 200. In a condition of applying a reverse voltage, multiplexers 102 and 104 connect supply source 108 to circuit chip 200.

The system further comprises MEMs switches, s11, s12, s21 and s22, to perform power and ground line swapping at the first metallization level. Desirably, these switches are placed at the first metal level so that the healing process will encompass all the rest of the metal levels. However, in other embodiments the switches may be located at other metal levels. Inside the circuit block 300 are groups of circuits having their power supply connected to a first-layer metal line, Vdd, and ground connected to another first-layer metal line, Vss. The MEMS switches s11, s12, s21 and s22 are situated to swap Vdd and ground through the higher level interconnect layers of m2 through m5 inside the chip 200. In a forward voltage condition, switches s21 and s12 are on and switches s11 and s22 are off, enabling current to flow in one direction through the metallization layers m2 through m5, and in a reverse voltage condition, switches s21 and s12 are off and switches s11 and s22 are on, enabling current to flow in an opposite direction through the metallization layers m2 through m5.

Figure 3:
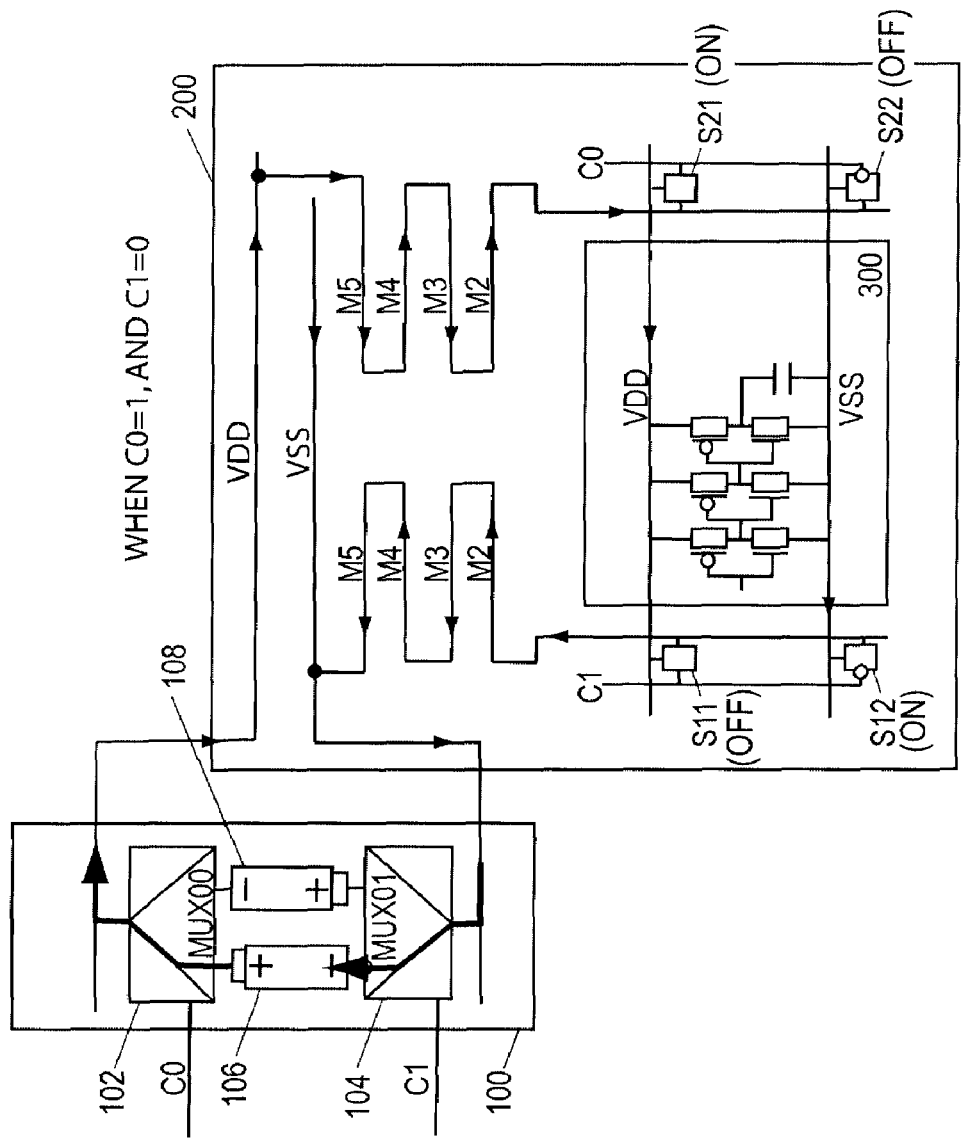
FIG. 3 depicts an embodiment for forward stressing of an integrated circuit.

FIG. 3 shows a forward stress cycle, with control signals c0=1, and c1=0, so that the power source 106 is in service. A positive pole of source 106 is connected to the Vdd lines in the chip to apply a forward voltage. The negative pole of source 106 is connected to the Vss lines of the chip. At this moment, s21 and s12 are on, while s22 and s11 are off. Thus, current flows from m5 to m2, through switch s21 to the Vdd of lines of circuitry 300. Similarly, current flows from Vss lines of circuitry 300 through s12, from m2 to m5, and to the negative pole of the source to complete the circuit. In response to the applied voltage, electrons flow opposite the direction indicated by the arrow.

Over time, as a result of the above-described forward stressing, interconnect resistances will continue to rise due to electro-migration. This is monitored by an EM sensor 400. When that level exceeds a preset target plus a hysteresis level, the EM sensor will emit a signal requesting the system to perform a reverse stress operation. In one embodiment, the system is powered down and then reverse stressing is applied by swapping Vss and Vdd lines, as described below with reference to FIG. 4. Performing reverse stressing without first powering down the system can be accomplished. One embodiment would be to provide sufficient local power supply decoupling to maintain the local power supply voltage whilst the reversal process was occurring. Another embodiment would be to use redundancy whereby several systems were effectively connected in parallel with the reversal process only being allowed on a subset of these systems at any one time. In this way during the supply interruption on one of the systems, the supply voltage would be maintained by the parallel wires which were not currently being reversed. This embodiment could be attractive when this scheme is implemented on power grids within chips where multiple wires would be capable of reverse operation and could be sequenced appropriately. In yet another embodiment, the chip is frozen in state while performing line swapping. In this case, the targeted wiring resistance (in terms of voltage) should be set more conservatively to allow extra processing time before the healing process can be executed.

Figure 4:
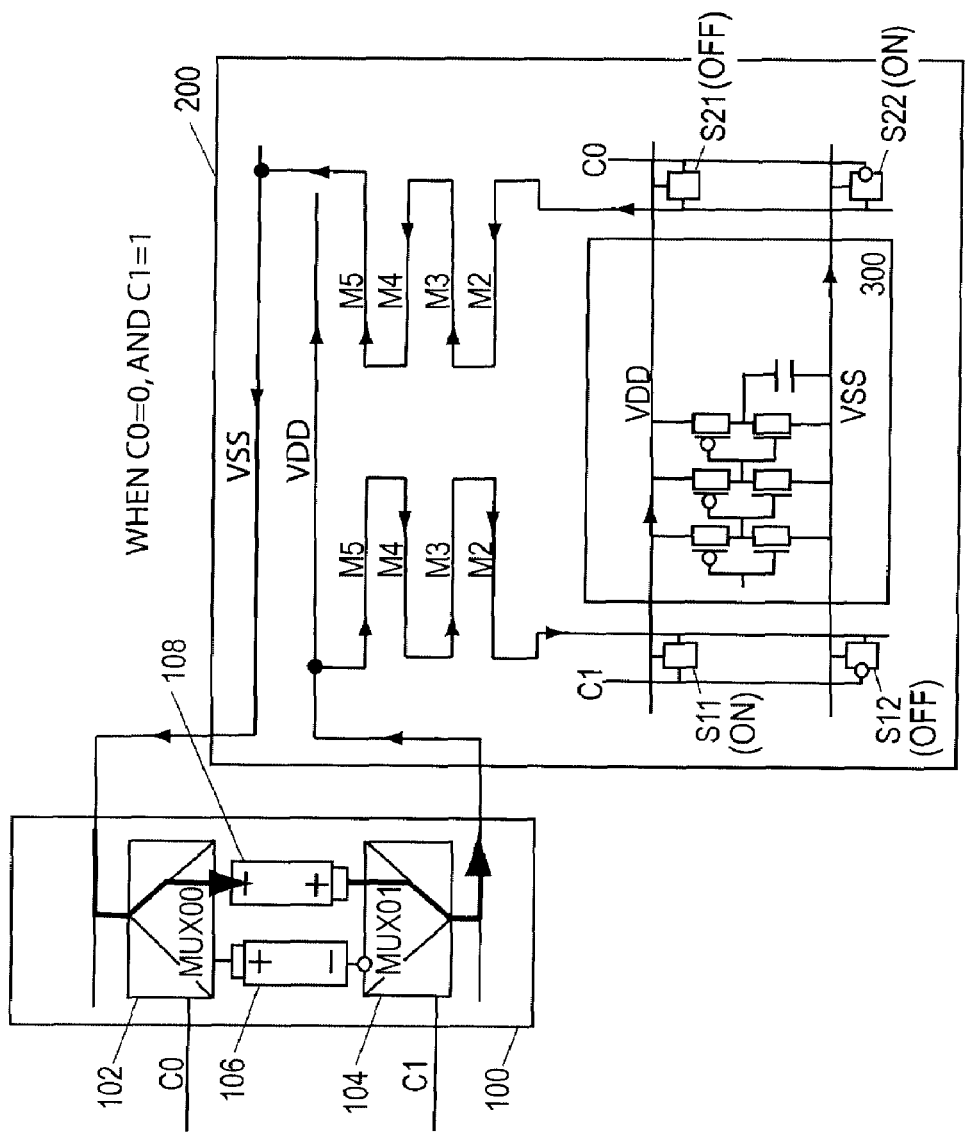
FIG. 4 depicts an embodiment for reverse stressing of an integrated circuit.

FIG. 4 shows a reverse stress cycle that can be applied during a power-on sequence. The control signals are c0=0, and c1=1, so that the second battery 108 is connected to circuit chip 200. In this condition of applying a reverse voltage, current is from the positive pole of supply 108, through layers m5 through m2, through switch s11, to the Vdd lines of circuitry 300 on level 1. Current is also from the Vss lines of circuitry 300 through switch s22, through m2 to m5, returning to the negative pole of supply 108. In response to the applied voltage, electrons flow opposite the direction indicated by the arrow.

During reverse EM stressing, line resistances will continue to decrease to a point before increasing again. The metal wiring resistance will be monitored by the EM sensor(s) 400. When that level drops below the preset target value plus hysteresis level, the EM sensor will request the system to resume the forward stress operation again. The duration of each cycle depends on the chip power supply level, current density, temperature and process robustness which may vary from weeks to years. Hysteresis is added to the comparator to avoid excessive switching caused by noise spikes and thus, to reduce the frequency at which the applied voltage is reversed.

Thus, embodiments include a system for monitoring and controlling electro-migration of metal wirings in an integrated circuit. The system comprises an electro-migration sensor to monitor a resistance and output a measurement voltage indicative of a value of the resistance, the resistance value affected by electro-migration. Circuitry is provided to compare the measurement voltage to a reference voltage. A switching network conditionally switches between applying a forward supply voltage to a portion of the integrated circuit and applying a reverse supply voltage to the portion of the integrated circuit. The switching network is responsive to a condition wherein the measurement voltage exceeds the reference voltage by a specifiable amount.

Figure 5:
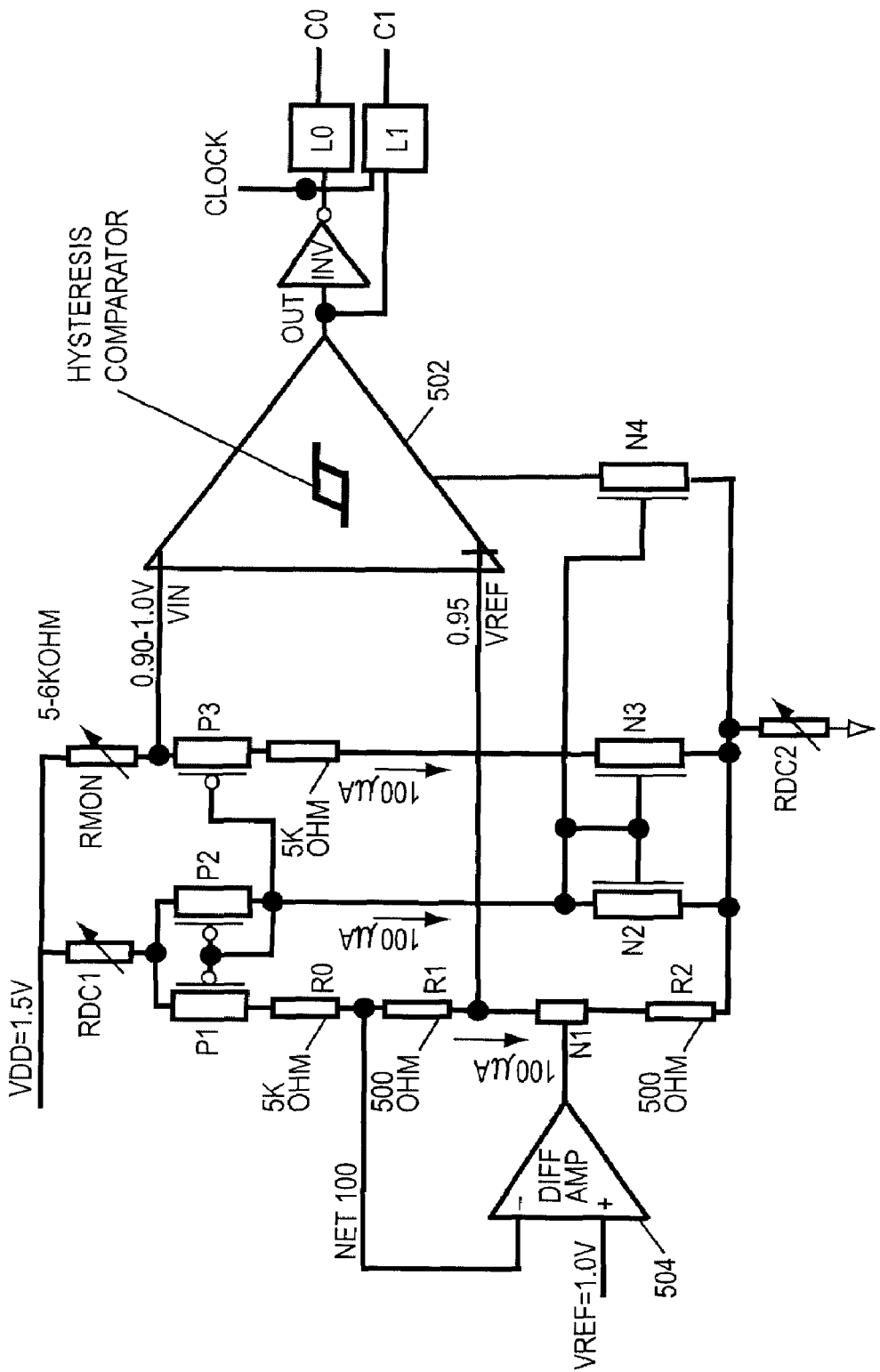
FIG. 5 depicts a low power, on-chip electro-migration sensor.

FIG. 5 shows an embodiment of an on-chip EM sensor, designed to detect a monitored resistive structure, "Rmon," having a designed resistance of about 5 k ohm. The Rmon resistive structure contains "real-life," multi-level metal interconnects connecting the Vin node of a hysteresis comparator 502 directly to a C4 pin of the power supply, e.g. Vdd=1.5V. Similarly, an identical Rmon resistance having about the same resistance, 5 k-ohm, will connect the Vin node directly to another C4 pin of ground for monitoring during the reverse stress cycle. More specifically, when switching to the reverse stress cycle, a MEMS switch will swap power lines with ground lines, at the same time the Rmon-to-power supply circuit is swapped with the Rmon-to-ground circuit.

When the resistance, Rmon, exceeds 20% of its design value, the circuit of FIG. 5 cannot be expected to function properly. Therefore, during the chip life time, the voltage at Vin will be allowed to vary between 0.9V to 1.0V. The EM sensor further comprises a reference generator to produce a reference level voltage (Vref=0.95V). The reference generator comprises elements which are insensitive to EM degradation. These elements can be made of materials such as, tungsten, poly-silicon, etc. A hysteresis comparator 502 compares the reference voltage, Vref, with the input voltage, Vin. When Vin exceeds Vref plus a preset hysteresis level (e.g. 0.01V) due to EM, the output of the comparator will switch from low to high.

The reference generator must be designed so that its net level is insensitive to EM degradation. A current source formed by pMOS device p2 and nMOS device n2, provides a 100 uA (microampere) current that is mirrored in the reference generator through pMOS device, p1. The reference generator comprises p1, resistance, r0 (5 k-ohms), resistance r1 (500 ohms), resistance r2 (500 ohms) and nMOS device n1. A differential amplifier 504 receives a reference voltage of 1.0V from a band gap reference generator. Amplifier 504 receives a voltage at its upper input that is constant. The resulting voltage at the Vref input of hysteresis comparator 502 will be kept constant at about 0.95V, unaffected by the EM degradation on the power wiring resistance Rdc1 or the on the ground wiring resistance Rdc2.

A 100 uA current flows through an evaluator circuit comprising pMOS device p3, nMOS device n3, and resistance r3. Since the monitored line resistance is nominally 5 k ohm, the 100 uA of current is required to create a voltage drop across Rmon that keeps Vin between 0.9 and 1.0V. Since EM degradation is a gradual aging process, the monitored resistance must be stressed all the time. The other circuit components, such as the reference generator, the comparator, etc., can use sampling techniques to conserve power. The complimentary outputs are latched into two registers L0 and L1 to produce outputs c0 and c1.

Thus, a real-life metal wiring structure, including multiple levels of metallization and vias, is used as the monitoring element. The resistance of the structure correlates well to the degree of EM stress on the metal wiring of the chip. Based on the inputs from on-chip sensors, an EM controller can advise the system when to start a new cycle.

Figure 6A:
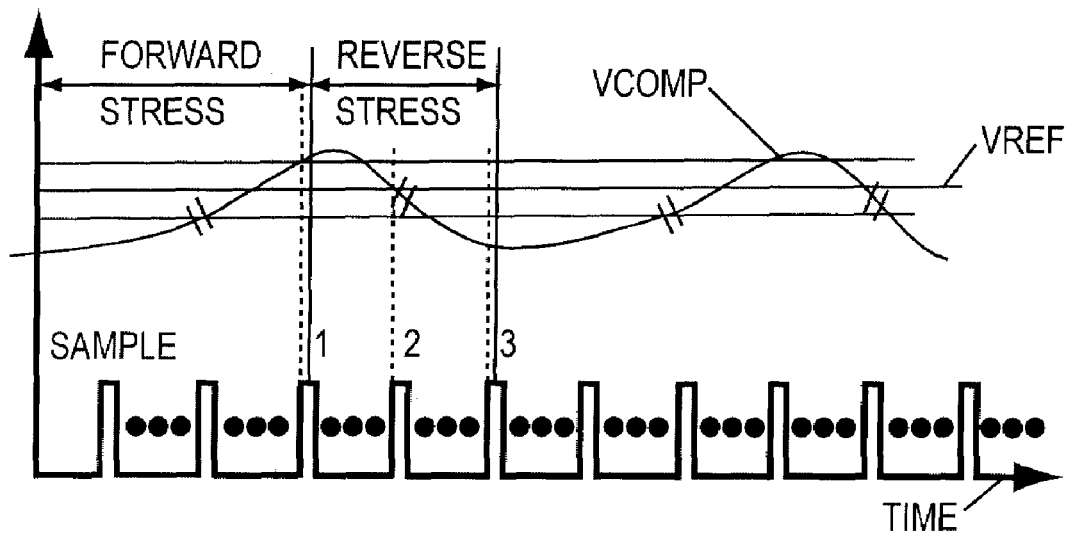
FIG. 6A depicts a waveform of a measurement voltage during forward and reverse stress cycles according to one embodiment.

FIG. 6A shows an example of forward and reverse stress cycles in relation to a sample clock. The forward and reverse stress cycles correspond respectively to conditions of forward and reverse applied voltage. The output voltage, Vcomp, of the hysteresis comparator is plotted versus time. FIG. 6A also shows a clock samples as a function of time (not all clock samples are shown.) During sampling, Vcomp appears to rise above the reference level, Vref, and start to exceed the hysteresis level. Therefore, a reverse stress cycle is demanded at clock sample number 1. In this condition, the system powers down. During power-up of the system, the power lines and ground lines swap via the MEMs switch system. A reverse stress cycle then ensues.

At clock sample number 2, the voltage is just less than Vref and within the hysteresis range of the sensor. Therefore, no action is taken as a result of the sample taken during clock sample 2. At clock sample number 3, Vcomp is below the lower hysteresis level. In response, the system initiates a forward cycle. And so forth. The diagram is illustrative. The time between forward and reverse cycles is in the period of weeks or years, and sample time can be in hours under normal operating conditions.

Figure 6B:
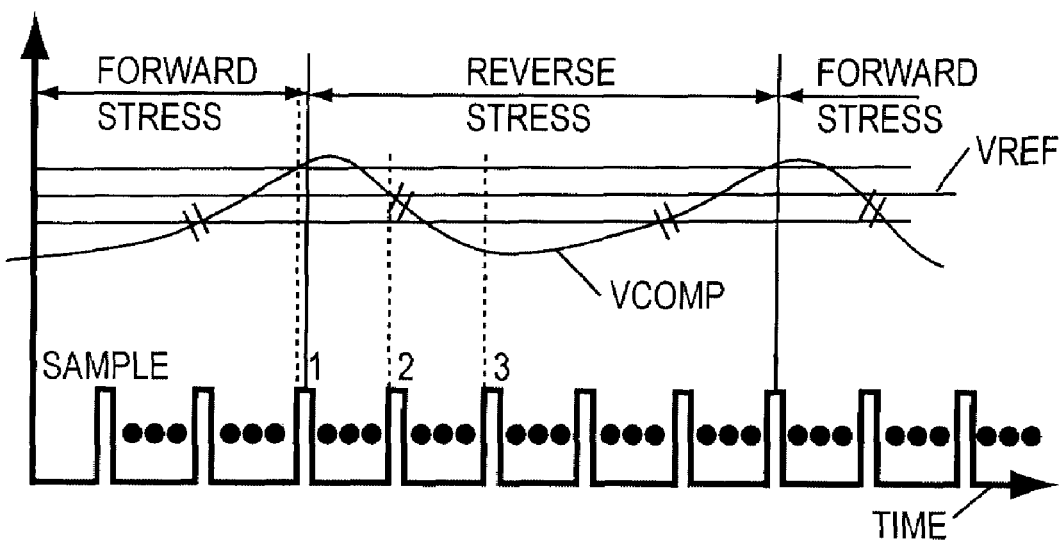
FIG. 6B depicts a waveform of a measurement voltage during forward and reverse stress cycles according to another embodiment.

It is also feasible to modify the comparator and EM control block to obtain a different result for the same waveform as shown in FIG. 6A. FIG. 6B shows that during reverse stress, when the Vcomp level is lower than the lower hysteresis level, the embodiment remains in a state of reverse stress. As noted above, when reverse stress is applied, the voltage, Vcomp will decline as the electro-migration characteristics begin to reverse. Over time, however, electro-migration tends to increase in a reverse direction. Then, Vcomp will begin to increase again. In the embodiment of FIG. 6B, a reversal of stress will not occur until Vcomp rises to again exceed the higher hysteresis level. In this embodiment, the frequency of reversal is reduced. Clearly, during reverse stress, electron wind blows in one direction and during forward stress, electron wind blows in the opposite direction.

Thus, the system will heal the EM defects by ion back flow. However, after some time, the micro-voids and micro-defects will start to show again due to the same mechanism. This is why wiring resistance will move lower first and then higher again. Further, wirings that connect to the output of an inverter are more tolerable to EM effects since when the inverter is on, charges from the power supply are charging up the wiring capacitors, and when the inverter is off, the wiring capacitors are discharged. That means current is alternately in both directions along the wires. Therefore, one of ordinary skill can size down these wirings since they bear higher resistance to EM.

Embodiments provide, therefore, an integrated circuit with controllable electro-migration characteristics. The circuit comprises a resistance comprising metallization affected by electro-migration. A circuit produces a measurement voltage indicative of the resistance at a first input of a comparator. The comparator compares the measurement voltage to a reference voltage received at a second input of the comparator. A plurality of switches conditionally switch between a forward circuit path and a reverse circuit path, the switches responsive to a condition where the measurement voltage exceeds the reference voltage by a first specifiable amount.

Figure 7:
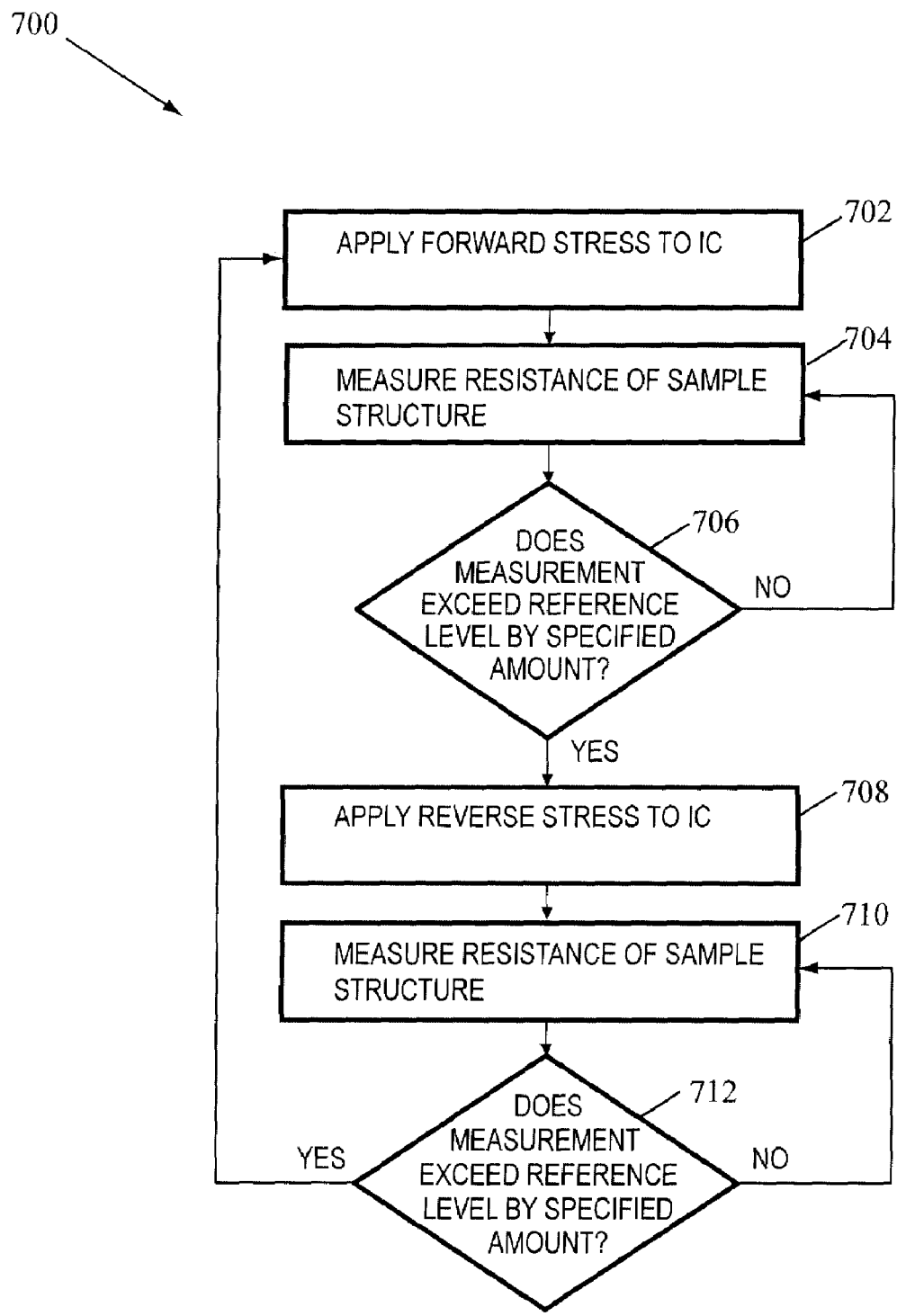
FIG. 7 depicts a flow chart of an embodiment of a method for controlling electro-migration of metal wirings in an integrated circuit

FIG. 7 shows a flow chart 700 of an embodiment of a method for controlling electro-migration of metal wirings in an integrated circuit. The system applies a forward stress (voltage) to the integrated circuit (element 702). Periodically, a measurement of the resistance of a sample structure is taken (element 704). If the measurement does not yet exceed the reference level plus a specified amount (element 706), then more measurement samples are taken (element 704). When the measurement does exceed the reference level by more than the specified amount (element 706), the system applies a reverse stress (voltage) to the integrated circuit (element 708). During the reverse stress condition, periodic measurements of the resistance of a sample structure are taken (element 710). If the measurement does not yet exceed the reference level plus a specified amount (element 712), then more measurement samples are taken (element 710). When the measurement does exceed the reference level by more than the specified amount (element 712), the system applies a forward stress to the integrated circuit (element 702) and the process continues.

Thus, an embodiment provides a complex resistance structure comprising metallization on multiple separate layers of the integrated circuit connected by vias. A forward voltage is applied to the integrated circuit and the resistance of the structure is monitored during the operation of the integrated circuit. A comparator receives as an input a voltage determined by the voltage drop across the resistance structure. As electro-migration continues, the resistance of the structure changes. Consequently, the measurement voltage input to the comparator changes. The other input to the comparator is a reference voltage to which the measurement voltage is compared. When the measurement voltage exceeds the reference voltage by a specified amount, micro-electro-mechanical switches change state. This applies a voltage of opposite polarity to the integrated circuit and changes direction of current in the circuit. The reversal of current counters the electro-migration that developed during forward stressing of the circuit.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling electro-migration of wirings in an integrated circuit during circuit operation, comprising:
   measuring the resistance of a sample structure within the integrated circuit to produce a measurement;
   comparing the measurement to a reference level; and
   applying a forward voltage to a portion of the wirings of the integrated circuit until the measurement varies from the reference level by at least a first specifiable amount; and then applying a reverse voltage to the same portion of the wirings of the integrated circuit until the measurement varies from the reference level by at least a second specifiable amount.

2. The method of claim 1, wherein the first and second specifiable amounts are equal.

3. The method of claim 1, further comprising switching from an applied forward voltage condition to an applied reverse supply voltage condition after a power-down sequence of the integrated circuit.

4. The method of claim 1, further comprising situating four micro-electro-mechanical switches in the integrated circuit to switch direction of current in a layer of metallization of the integrated circuit.

5. The method of claim 1, wherein the sample structure comprises multiple separated layers of metallization connected by vias.

6. The method of claim 1, wherein, during a condition of applying a forward voltage, a first resistance is measured, and during a condition of applying a reverse voltage, a second resistance is measured.

* * * * *